United States Patent [19]

Benson

[11] Patent Number: 4,536,239
[45] Date of Patent: Aug. 20, 1985

[54] MULTI-LAYER CIRCUIT BOARD INSPECTION SYSTEM

[75] Inventor: Robert F. Benson, San Jose, Calif.

[73] Assignee: Nicolet Instrument Corporation, Madison, Wis.

[21] Appl. No.: 514,624

[22] Filed: Jul. 18, 1983

[51] Int. Cl.³ .............................................. G01B 15/00
[52] U.S. Cl. .................................. 156/64; 156/272.2; 156/378; 156/379; 156/379.8; 250/398; 250/491.1
[58] Field of Search ...................... 156/64, 272.2, 378, 156/379, 379.8; 250/398, 491.1

[56] References Cited

U.S. PATENT DOCUMENTS 4,159,436 6/1979 Ely .................................... 250/398 X
4,327,292 4/1982 Wang et al. ..................... 250/398 X Primary Examiner—Robert A. Dawson
Attorney, Agent, or Firm—Kinney & Lange

[57] ABSTRACT

An inspection system for use in the fabrication of circuit boards of multiple, precisely registered layers. Each layer that is to be precisely registered within the circuit board is formed with at least two targets, each target corresponding in position to a target of another layer, and the targets of each layer defining a pattern that is unique to that layer. Radiography techniques allow a viewing of the registration of each target of a layer relative to a test target pattern. The test target pattern may be carried on a master template for the testing of individual layers for dimensional stability prior to stacking of the layers for lamination. Alternatively, the multiple layers may be stacked in their desired order, in which case the test target pattern for the targets of one layer are formed by the targets of at least two other layers. Layer registration of the multiple layers may be viewed prior to lamination, with adjustment or replacement of any mis-registered layer, or after lamination and prior to further processing. The targets may be formed in positions that define a pattern that is unique to a layer or in configuration that defines a pattern that is unique to a layer, or both.

8 Claims, 4 Drawing Figures

MULTI-LAYER CIRCUIT BOARD INSPECTION SYSTEM

BACKGROUND OF THE INVENTION

1. Field of the Invention

The present invention relates to multi-layer circuit boards and, particularly, to the inspection of such boards during their fabrication.

Multi-layer circuit boards have been defined as an interconnect package which contains more than two layers of circuitry. Having grown out of space and military applications in the early 60s, multi-layer boards are now used in many commercial applications. The various types of multi-layer boards fall into several categories, all sharing common problems, to varying degrees.

2. Description of the Prior Art

One problem encountered in the fabrication of multi-layer boards is dimensional stability, or the lack of it, as the individual layers are processed. That is, each layer is designed in anticipation of precise registration with the other layers that form the multi-layer board. However, unless each of the layers undergoes identical dimensional alterations during its individual processing, precision that existed in the original artwork may be lost. This could result in a critical misalignment in the multi-layer board and result in its rejection. In other instances, misregistration may be compensated for after lamination, and during drilling, by providing a compensating offset within the drilling operation.

SUMMARY OF THE INVENTION

The present invention provides an inspection system for use in the fabrication of circuit boards of multiple, precisely registered layers. At least two targets are formed on each layer, to be precisely registered during layer fabrication. Each target corresponds in position to a target of at least one other layer, with the targets of each layer defining a pattern that is unique to that layer. During fabrication, the registration of each target of a layer may be viewed relative to a test target pattern via radiography techniques. Thus, the dimensional stability of each individual layer may be determined during and after their fabrication, while the relative registration of stacked layers may be determined through the relative registration of their target patterns to a test target pattern. In stacked relation, the test target pattern for the targets of one layer may be formed by the targets of at least two other layers.

As noted above, each layer may be inspected during and after its fabrication and be discarded if it is out of tolerance. After stacking, and before lamination, the relative registration of the stacked layers may be inspected, with a corresponding adjustment or replacement of misregistered layers, before lamination. After lamination, the relative registration of the layers may be determined and further fabricating costs saved, or compensating allowances made in the completion of the fabrication process.

DETAILED DESCRIPTION OF THE PREFERRED EMBODIMENTS

The present invention provides an inspection system for use in the fabrication of circuit boards of multiple, precisely registered layers. At least two targets are formed on each layer that will be precisely registered relative to the targets of other layers, with each target corresponding in position to a target of at least one other layer and the targets of each layer defining a pattern that is unique to that layer. As will be explained more fully below, the unique target pattern of each layer may be established by the positions of the target of that layer, the configurations of the targets of that layer, or both. The targets are formed in such a way that they may be viewed by known radiography techniques. Preferably, the targets are formed with the other printed circuit elements on the layer on which they are carried.

For the purpose of this Specification and Claims, the "position" of a target on a layer is the position of that target relative to the other circuit elements on that layer such that registration of the targets in a multi-layer board indicates registration of the circuit elements carried by those layers.

In carrying out the inspection techniques of the present invention, any suitable radiographic system may be employed. One that may be employed, with minor modification to accommodate the size of the multi-layer circuit boards to which the present invention is directed, is that sold under the trademark MIKROX by Nicolet XRD Corporation, a subsidiary of Nicolet Instrument Corporation. A related device is disclosed in U.S. Pat. No. 4,159,436, issued Jan. 26, 1979 to Raymond V. Ely and entitled "Electron Beam Focussing for X-Ray Apparatus," which is commonly owned with the present invention and which is hereby incorporated by reference. The advantage of these radiographic systems is that they provide an X-ray source that is essentially a "point source" and which allows a magnification of the part being inspected. The use of an X-ray-sensitive TV camera and monitor allows a real-time viewing of the inspected part. For the purpose of this Specification and Claims, however, the term "viewing" is intended to embrace both a real-time display on a TV monitor as well as a film exposure and its subsequent review.

Figure 1:
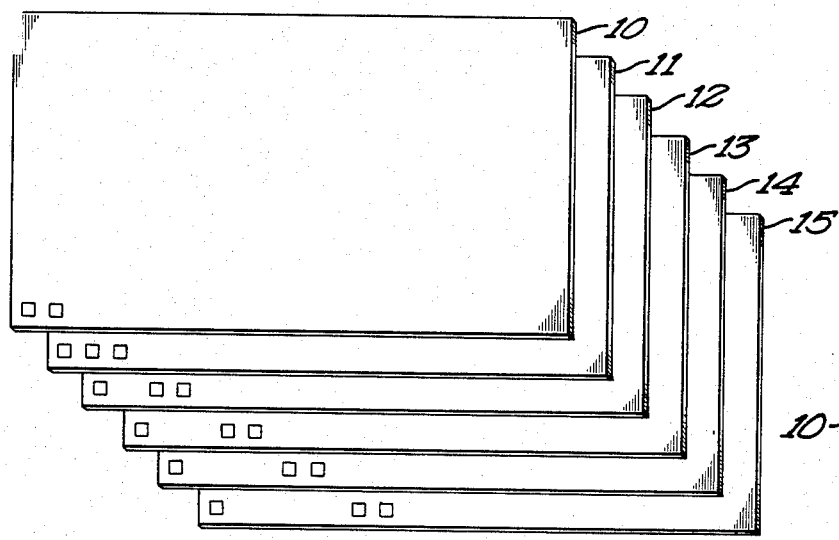
FIG. 1 illustrates multiple layers that may form a multi-layer circuit board and the concept underlying the present invention.

Referring now to FIG. 1, there are shown six layers, 10–15, which may be laminated to form a multi-layer circuit board. For the sake of clarity, the circuit elements of the several layers are not illustrated. In the lower left corner of each layer is a target pattern, the targets being illustrated as solid figures which must be formed in a manner so as to be detectible by the particular viewing technique employed. In the case of radiography techniques, the targets are radiopaque and may be formed during the formation of the circuit elements on the several layers, and in a defined relationship therewith. This defined relationship allows a registration determination between the targets of the several layers to determine the registration of the circuit elements of the several layers.

In FIG. 1, the several targets are each of the same configuration (square), while occupying predetermined positions. For example, layer 10 has targets in positions that may be identified as positions 1 and 2, while layer 11 has targets in positions 1, 2 and 3. Each of the layers 12-15 has a target in position 1, with layer 12 having additional targets in positions 3 and 4, layer 13 in positions 4 and 5, layer 14 in positions 5 and 6, and layer 15 in positions 6 and 7.

Figure 2:
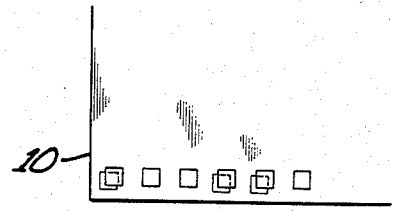
FIG. 2 illustrates the manner by which misregistration may be detected within multiple layers of a multi-layer circuit board.

With the layers 10 through 15 in stacking relation to each other in what is believed to be proper registration, a radiographic viewing will establish whether proper registration is, in fact, present. This is illustrated in FIG. 2, where a regular pattern of six targets is illustrated, with misregistered targets being illustrated at positions 1, 4 and 5. With reference to FIG. 1, it can be seen that the targets of the stacked layers form a test target pattern, with the targets of layer 13 being out of registration with that test target pattern. Thus, layer 13 is misregistered. FIG. 2 also illustrates the way by which the degree of misregistration can be estimated. For example, if each of the targets has a known dimension and one of the layers is misregistered so as to overlie the test target pattern formed by the other layers by half of the target dimension, the misregistered layer is misregistered by an amount approximately one-half the dimension of the targets. As seen in FIG. 2, the direction of misregistration can also be determined.

Figure 3:
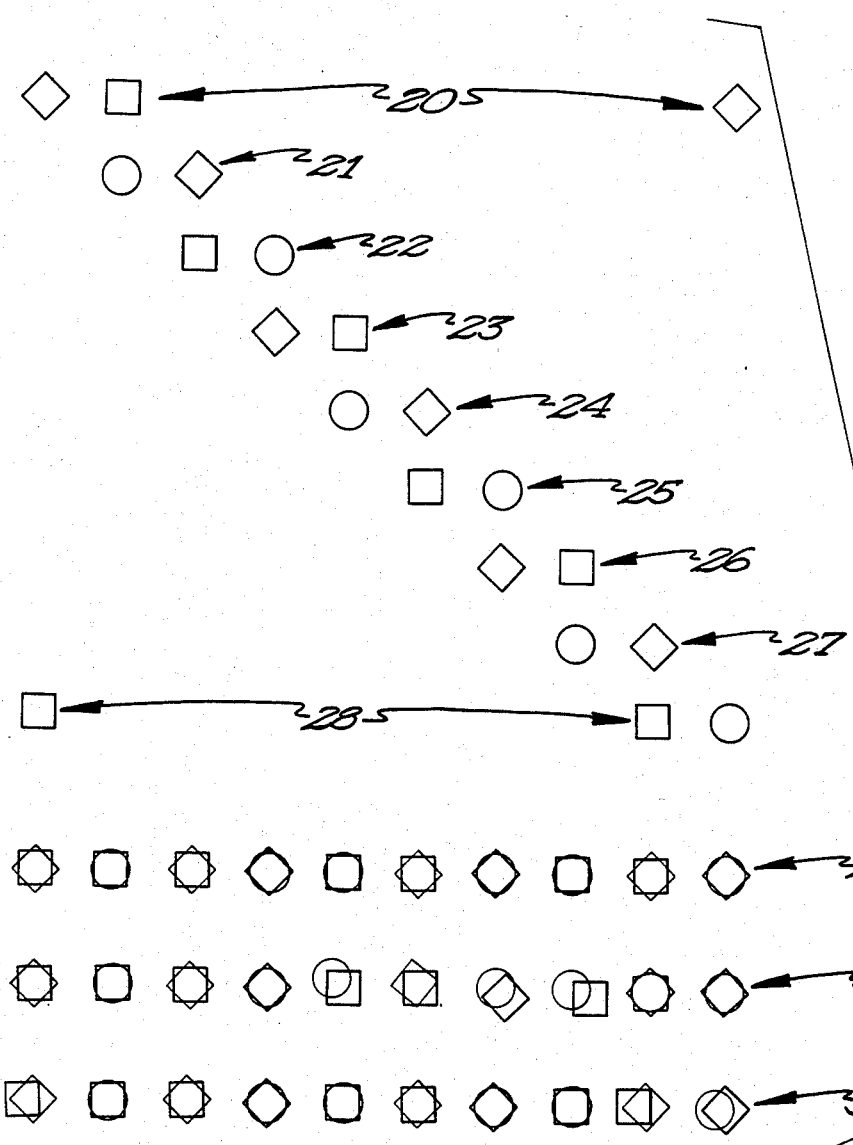
FIG. 3 illustrates multiple target patterns that may be employed within the scope of the present invention and the manner by which they indicate misregistration.

FIG. 3 illustrates alternative patterns that may be employed to identify different layers of a multi-layer circuit board. The patterns of FIG. 3 are dependent not only on position of the targets but also their configuration. For example, the pattern indicated generally at 20 is a three-target pattern having a diamond in the first position, a square in the second position, and a diamond in the tenth position. Pattern 21 is formed with a circle in the second position and a diamond in the third position. The other patterns may be as shown.

A nine-layer circuit board employing the patterns illustrated in the upper portion of FIG. 3 will produce a pattern illustrated at line 29 of FIG. 3 when all of the layers are in proper registration. Line 30 illustrates what would be viewed if the layer of pattern 24 were out of registration upwardly and to the left and with the layer of pattern 26 misregistered downwardly and to the right. Line 31 illustrates what would be viewed if the layer of pattern 28 were misregistered to the left as viewed in FIG. 3.

Figure 4:
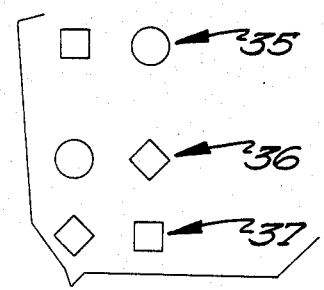
FIG. 4 illustrates further alternative patterns that may be employed within the scope of the present invention.

FIG. 4 illustrates patterns 35-37, which may be employed on a three-layer board with the patterns differing only by their configuration. That is, in terms of positions as discussed with reference to FIGS. 2 and 3, each of patterns 35-37 is formed with targets in the first and second position, with the patterns differing from each other by a difference in the configuration of the targets that form them. Misregistration of patterns 35-37, when the layers that carry them are laid in stacking relation to each other, will give an indication of a misregistration of those layers.

In addition to giving an indication of misregistration between layers, the present invention may be employed to determine the dimensional stability, or lack thereof, of a single layer. In a multi-layer context, a test target pattern for each layer is formed by the targets of at least two other layers. Alternatively, a master template may be employed, the template carrying a test target pattern corresponding to the pattern of the layer it is wished to inspect. By properly overlaying the layer with the template, and viewing it as described above, the registration of the layer pattern relative to the test target pattern may be employed to establish the dimensional stability or instability of the layer being processed.

Obviously, many modifications and variations of the present invention are possible in light of the above teachings. For example, the present invention may be employed for inspection during any stage of multi-layer circuit board fabrication, including:

During and after processing of each layer, the relative registration of stacked layers prior to lamination and the relative registration of the layers of a laminated circuit board.

The pre-lamination registration of stacked layers may be inspected while those layers are within the laminating caul plates, as by providing inspection ports in those plates, with suitable closures for those ports.

Many target patterns may be employed within the scope of the present invention, which is not limited to the patterns disclosed herein. Indeed, the individual targets may be solid or outline figures, and may be positioned along one or more sides of each layer. While it is anticipated that the target patterns will be contained within the border of each layer, where practical, they may be positioned within the "artwork" of the circuitry carried by each layer. It is therefore to be understood that, within the scope of the appended claims, the invention may be practiced otherwise than as specifically described.

What is claimed is:

1. An inspection method for use in the fabrication of circuit boards of more than two, precisely registered layers comprising the steps of:
    forming at least two targets on each layer to be precisely registered, each target corresponding in position to a target of at least one other layer and the targets of each layer defining a pattern that is unique to that layer;
    viewing the registration of each target of a layer relative to a test target pattern via radiography techniques.

2. The method of claim 1 wherein the step of viewing comprises the steps of:
    positioning a layer in stacking relation to a master template, the master template carrying a test target pattern including targets corresponding to the pattern of that layer in stacking relation to the master template; and
    viewing the registration of each target of that layer in stacking relation to the master template with the corresponding target of the test target pattern of the master template via radiography techniques.

3. The method of claim 1 wherein the step of viewing comprises the steps of:
    positioning multiple layers, in their desired order, in stacking relation to each other, the test target pattern for the targets of one layer being formed by the targets of at least two other layers; and
    viewing the registration of each target of each stacked layer with the test target pattern formed by the targets of the other stacked layers via radiography techniques.

4. The method of claim 3 wherein the step of positioning comprises the step of assembling said multiple layers in caul plates for lamination thereof and the step of viewing comprises the step of viewing the registration of each target of each stacked layer with the test target pattern formed by the targets of the other stacked layers via radiography techniques after said assembling step.

5. The method of claim 3 further comprising the step of laminating said multiple layers in their desired order, said viewing step being performed after said laminating step.

6. The method of claim 1 wherein said forming step comprises the step of forming targets in positions that define a pattern that is unique to a layer.

7. The method of claim 1 wherein said forming step comprises the step of forming targets in target configurations that define a pattern that is unique to a layer.

8. The method of claim 1 wherein said forming step comprises the step of forming targets in positions and configurations that define a pattern that is unique to a layer.

* * * * *